US012813201B2

(12) United States Patent
Cong et al.

(10) Patent No.: US 12,813,201 B2
(45) Date of Patent: Nov. 24, 2026

(54) TRANSFER APPARATUS, AND RELATED COMPONENTS AND METHODS, FOR TRANSFERRING SUBSTRATES

(71) Applicant: Applied Materials, Inc., Santa Clara, CA (US)

(72) Inventors: Zhepeng Cong, San Jose, CA (US); Masato Ishii, Sunnyvale, CA (US); Ernesto J. Ulloa, San Jose, CA (US); Shu-Kwan Lau, Sunnyvale, CA (US); Bharath Bopanna Puttichanda, Santa Clara, CA (US); Ashur J. Atanos, San Jose, CA (US); Andrew Kretzschmar, Wimberley, TX (US)

(73) Assignee: Applied Materials, Inc., Santa Clara, CA (US)

( * ) Notice: Subject to any disclaimer, the term of this patent is extended or adjusted under 35 U.S.C. 154(b) by 904 days.

(21) Appl. No.: 18/108,432

(22) Filed: Feb. 10, 2023

(65) Prior Publication Data

US 2024/0274448 A1 Aug. 15, 2024

(51) Int. Cl.
*H10P 72/00* (2026.01)
*C23C 16/458* (2006.01)
(Continued)

(52) U.S. Cl.
CPC ...... *H10P 72/0464* (2026.01); *C23C 16/4583* (2013.01); *C23C 16/46* (2013.01);
(Continued)

(58) Field of Classification Search
CPC ............. H10P 72/0464; H10P 72/3302; H10P 72/3304; H10P 72/7602; H10P 72/0454;
(Continued)

(56) References Cited

U.S. PATENT DOCUMENTS 6,108,937 A * 8/2000 Raaijmakers ....... H10P 72/0434 34/448
6,297,611 B1 * 10/2001 Todorov .................. B25J 9/107 318/567

(Continued)

FOREIGN PATENT DOCUMENTS

CN 113990780 A 1/2022
CN 111893567 B 2/2022

(Continued)

*Primary Examiner* — Rodney G Mcdonald
(74) *Attorney, Agent, or Firm* — Patterson + Sheridan, LLP

(57) ABSTRACT

The present disclosure relates to transfer chambers, systems, and related components and methods, for pre-heating and pre-cooling substrate transfer apparatus. In one or more embodiments, the transfer apparatus are pre-heated and pre-cooled in relation to transferring substrates for substrate processing operations as part of semiconductor manufacturing. In one or more embodiments, a transfer chamber applicable for use in semiconductor manufacturing includes an internal volume, one or more sidewalls at least partially defining the internal volume, and a transfer apparatus disposed in the internal volume. The transfer apparatus includes one or more links, one or more motors configured to pivot the one or more links, and one or more substrate holders coupled to the one or more links. The transfer chamber includes a window that includes a transparent material, and one or more heat sources configured to direct heat into the internal volume through the window.

20 Claims, 9 Drawing Sheets

(51) Int. Cl.

| | |
|---|---|
| ***C23C 16/46*** | (2006.01) |
| ***C23C 16/52*** | (2006.01) |
| ***C30B 25/10*** | (2006.01) |
| ***C30B 25/12*** | (2006.01) |
| ***H10P 72/30*** | (2026.01) |
| ***H10P 72/76*** | (2026.01) |

(52) U.S. Cl.
CPC .............. *C23C 16/52* (2013.01); *C30B 25/10* (2013.01); *C30B 25/12* (2013.01); *H10P 72/3302* (2026.01); *H10P 72/3304* (2026.01); *H10P 72/7602* (2026.01); *H10P 72/0454* (2026.01)

(58) Field of Classification Search
CPC ............. H10P 72/0602; H10P 72/0434; H10P 72/0436; C23C 16/4583; C23C 16/46; C23C 16/52; C30B 25/10; C30B 25/12; C30B 35/005
USPC .......................................................... 118/719
See application file for complete search history.

(56) References Cited

U.S. PATENT DOCUMENTS

| | | | | |
|---|---|---|---|---|
| 6,558,509 | B2 * | 5/2003 | Kraus | H10P 72/0454 118/719 |
| 10,792,822 | B2 | 10/2020 | Hosek et al. | |
| 10,861,736 | B2 | 12/2020 | Gangakhedkar et al. | |
| 11,177,146 | B2 * | 11/2021 | Peng | H10P 72/0602 |
| 2011/0064545 | A1 * | 3/2011 | Ishikawa | H10P 72/0464 414/217 |
| 2014/0262035 | A1 * | 9/2014 | Merry | H10P 72/0462 156/345.31 |
| 2018/0315626 | A1 | 11/2018 | Franklin | |
| 2020/0273826 | A1 * | 8/2020 | Kroetz | H10P 72/7602 |
| 2022/0028712 | A1 * | 1/2022 | Prasad | H10P 72/0602 |
| 2022/0121196 | A1 | 4/2022 | Omori | |
| 2022/0162751 | A1 | 5/2022 | Haanstra et al. | |
| 2022/0170156 | A1 | 6/2022 | Jdira et al. | |
| 2022/0181193 | A1 | 6/2022 | Gao et al. | |
| 2022/0189804 | A1 | 6/2022 | Luan et al. | |
| 2022/0199444 | A1 | 6/2022 | Oosterlaken et al. | |
| 2022/0254668 | A1 | 8/2022 | Oosterlaken et al. | |
| 2022/0268520 | A1 | 8/2022 | Oosterlaken et al. | |
| 2022/0298643 | A1 | 9/2022 | Kajbafvala et al. | |
| 2022/0298672 | A1 | 9/2022 | M'Saad et al. | |
| 2022/0301829 | A1 | 9/2022 | Yoshikawa | |
| 2022/0301905 | A1 | 9/2022 | Ye et al. | |
| 2022/0301906 | A1 | 9/2022 | Naik et al. | |
| 2022/0352006 | A1 | 11/2022 | Huang et al. | |
| 2022/0359246 | A1 | 11/2022 | Umeoka | |

FOREIGN PATENT DOCUMENTS

| | | | | |
|---|---|---|---|---|
| CN | 114000192 | A | 2/2022 | |
| CN | 111254487 | B | 3/2022 | |
| CN | 114138030 | A | 3/2022 | |
| CN | 114158145 | A | 3/2022 | |
| CN | 114351249 | A | 4/2022 | |
| CN | 111235551 | B | 5/2022 | |
| CN | 114481311 | A | 5/2022 | |
| CN | 114540947 | A | 5/2022 | |
| CN | 114540948 | A | 5/2022 | |
| CN | 114551331 | A | 5/2022 | |
| CN | 114613703 | A | 6/2022 | |
| CN | 114743924 | A | 7/2022 | |
| CN | 114823428 | A | 7/2022 | |
| CN | 114855272 | A | 8/2022 | |
| CN | 114883221 | A | 8/2022 | |
| CN | 114914181 | A | 8/2022 | |
| CN | 114927450 | A | 8/2022 | |
| CN | 115020281 | A | 9/2022 | |
| CN | 115101432 | A | 9/2022 | |
| CN | 115101443 | A | 9/2022 | |
| CN | 115101470 | A | 9/2022 | |
| CN | 115233303 | A | 10/2022 | |
| CN | 115235257 | A | 10/2022 | |
| CN | 115274510 | A | 11/2022 | |
| CN | 115312432 | A | 11/2022 | |
| CN | 115404543 | A | 11/2022 | |
| EP | 1189264 | A1 * | 3/2002 | H10P 72/0411 |

* cited by examiner

TRANSFER APPARATUS, AND RELATED COMPONENTS AND METHODS, FOR TRANSFERRING SUBSTRATES

BACKGROUND

Field

The present disclosure relates to transfer chambers, systems, and related components and methods, for pre-heating and pre-cooling substrate transfer apparatus.

Description of the Related Art

Semiconductor substrates are processed for a wide variety of applications, including the fabrication of integrated devices and microdevices. Temperature differences between substrates and transfer components can hinder operations. As an example, temperature differences can cause lower heating powers and/or lower processing temperatures, which can cause longer processing times and lower throughput. As another example, temperature differences can cause thermal shock (which can bow substrates and/or can damage transfer components over time), which hinders device performance, lowers throughput, and hinders substrate handling. As another example, temperature differences can affect deposition uniformity on substrates, which hinders device performance and lowers throughput.

Such issues can be exacerbated by relatively complex deposition operations (such as high-temperature deposition operations).

Therefore, a need exists for improved transfer apparatus, and related components and methods, that facilitate reduced thermal shock and increased throughput.

SUMMARY

The present disclosure relates to transfer chambers, systems, and related components and methods, for pre-heating and pre-cooling substrate transfer apparatus. In one or more embodiments, the transfer apparatus are pre-heated and pre-cooled in relation to transferring substrates for substrate processing operations as part of semiconductor manufacturing.

In one or more embodiments, a transfer chamber applicable for use in semiconductor manufacturing includes an internal volume, one or more sidewalls at least partially defining the internal volume, and a transfer apparatus disposed in the internal volume. The transfer apparatus includes one or more links, one or more motors configured to pivot the one or more links, and one or more substrate holders coupled to the one or more links. The transfer chamber includes a window that includes a transparent material, and one or more heat sources configured to direct heat into the internal volume through the window.

In one or more embodiments, a method of substrate transfer applicable for semiconductor manufacturing includes moving a substrate holder to align the substrate holder with one or more fields of view of one or more heat sources. The method includes heating at least a portion of the substrate holder for a heating period to a target heating temperature using the one or more heat sources. The method includes after the heating of the substrate holder to the target heating temperature, moving the substrate holder into a processing volume of a processing chamber. The method includes engaging a substrate in the processing volume with the substrate holder, and moving the substrate out of the processing volume while the substrate is supported on the substrate holder.

In one or more embodiments, a system applicable for semiconductor manufacturing includes a transfer chamber. The transfer chamber includes an internal volume, and a transfer apparatus disposed in the internal volume. The transfer apparatus includes one or more links, one or more motors configured to pivot the one or more links, and one or more substrate holders coupled to the one or more links. The transfer chamber includes a window that includes a transparent material, and one or more heat sources configured to direct heat into the internal volume through the window. The system includes one or more thermal sensors configured to detect a thermal condition. The system includes a deposition chamber interfacing with the transfer chamber, and a controller. The controller includes instructions that, when executed, cause: moving the substrate holder to align the substrate holder with one or more fields of view of the one or more heat sources, and powering the one or more heat sources to heat at least a portion of the substrate holder for a heating period to a target heating temperature. The instructions, when executed cause: after the heating of the substrate holder to the target heating temperature, moving the substrate holder into a processing volume of the deposition chamber. The instructions, when executed cause: engaging a substrate in the deposition chamber with the substrate holder, and moving the substrate out of the processing volume while the substrate is supported on the substrate holder.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to transfer chambers, systems, and related components and methods, for pre-heating and pre-cooling substrate transfer apparatus. In one or more embodiments, the transfer apparatus are pre-heated and pre-cooled in relation to transferring substrates for substrate processing operations as part of semiconductor manufacturing.

The disclosure contemplates that terms such as “couples,” “coupling,” “couple,” and “coupled” may include but are not limited to welding, fusing, melting together, interference fitting, and/or fastening such as by using bolts, threaded connections, pins, and/or screws. The disclosure contemplates that terms such as “couples,” “coupling,” “couple,” and “coupled” may include but are not limited to integrally forming. The disclosure contemplates that terms such as “couples,” “coupling,” “couple,” and “coupled” may include but are not limited to direct coupling and/or indirect coupling, such as indirect coupling through components such as links, blocks, and/or frames.

Figure 1:
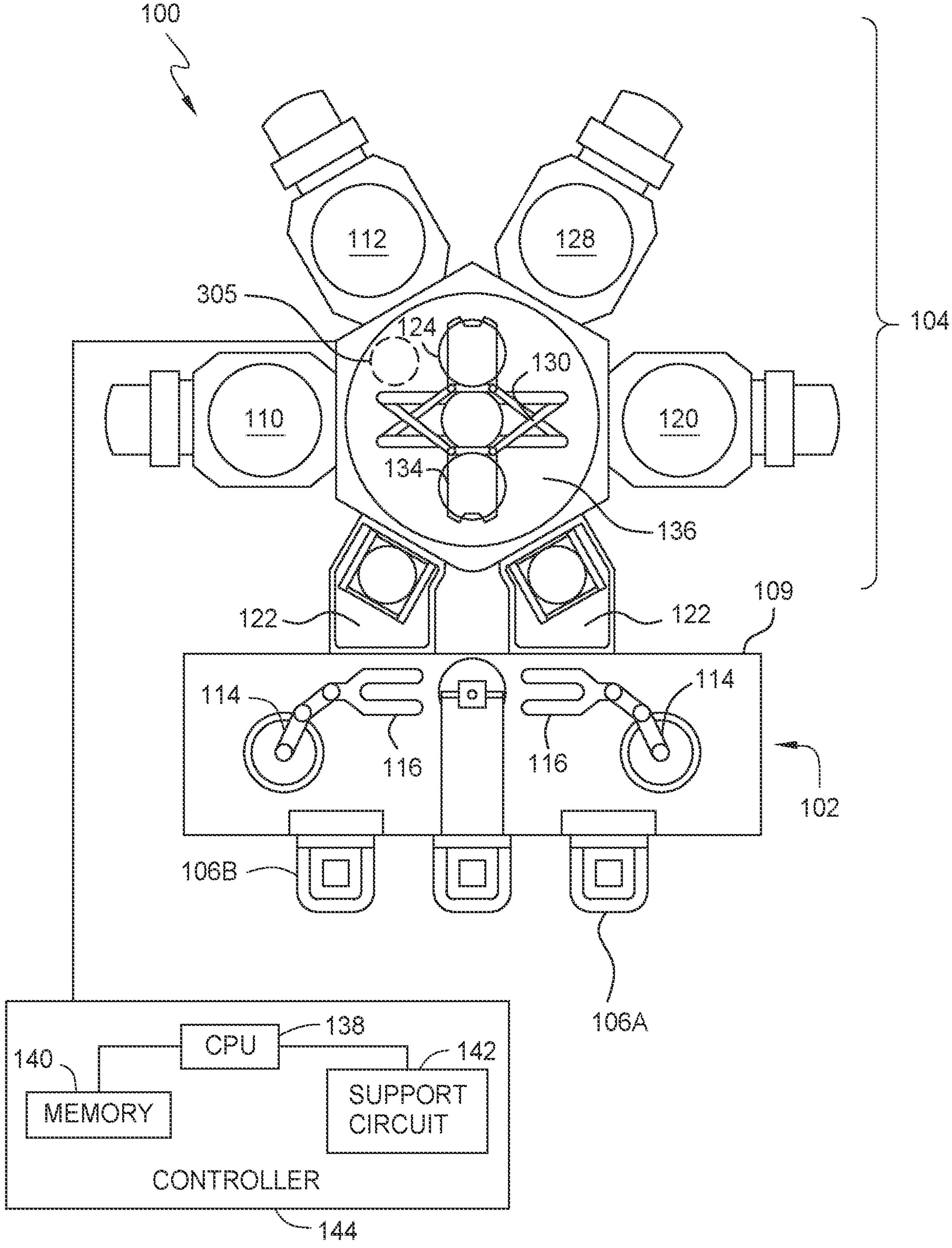
FIG. 1 is a schematic diagram top plan view of a processing system, according to one or more embodiments.

FIG. 1 is a schematic diagram top plan view of a processing system 100, according to one or more embodiments. The processing system 100 includes one or more load lock chambers 122 (two are shown in FIG. 1), a processing platform 104, a factory interface 102, and a controller 144. In one or more embodiments, the processing system 100 is a CENTURA® integrated processing system, commercially available from Applied Materials, Inc., located in Santa Clara, California. It is contemplated that other processing systems (including those from other manufacturers) may be adapted to benefit from the disclosure.

The platform 104 includes a plurality of processing chambers 110, 112, 120, 128, and the one or more load lock chambers 122 that are coupled to a transfer chamber 136. The transfer chamber 136 can be maintained under vacuum, or can be maintained at an ambient (e.g., atmospheric) pressure. Two load lock chambers 122 are shown in FIG. 1. The factory interface 102 is coupled to the transfer chamber 136 through the load lock chambers 122.

In one or more embodiments, the factory interface 102 includes at least one docking station 109 and at least one factory interface robot 114 to facilitate the transfer of substrates. The docking station 109 is configured to accept one or more front opening unified pods (FOUPs). Two FOUPS 106A, 106B are shown in the implementation of FIG. 1. The factory interface robot 114 having a blade 116 disposed on one end of the robot 114 is configured to transfer one or more substrates from the FOUPS 106A, 106B, through the load lock chambers 122, to the processing platform 104 for processing. Substrates being transferred can be stored at least temporarily in the load lock chambers 122.

Each of the load lock chambers 122 has a first port interfacing with the factory interface 102 and a second port interfacing with the transfer chamber 136. The load lock chambers 122 are coupled to a pressure control system (not shown) which pumps down and vents the load lock chambers 122 to facilitate passing the substrates between the environment (e.g., vacuum environment or ambient environment, such as atmospheric environment) of the transfer chamber 136 and a substantially ambient (e.g., atmospheric) environment of the factory interface 102.

The transfer chamber 136 has a vacuum robot 130 disposed therein. The vacuum robot 130 has one or more blades 134 (two are shown in FIG. 1) capable of transferring the substrates 124 between the load lock chambers 122 and the processing chambers 110, 112, 120, 128.

The controller 144 is coupled to the processing system 100. The controller 144 controls the operations of the system 100 using a direct control of the processing chambers 110, 112, 120, 128 of the system 100 or alternatively, by controlling the computers (or controllers) associated with the processing chambers 110, 112, 120, 128, and the system 100. In operation, the controller 144 enables data collection and feedback from the respective chambers and controller 144 to optimize performance of the system 100.

The controller 144 is used to control processes and methods, such as the operations of the methods described herein (for example the operations of the method 1000 and/or the method 1050 described below). The controller 144 includes a central processing unit (CPU) 138, a memory 140 containing instructions, and support circuits 142 for the CPU. The controller 144 controls various items directly, or via other computers and/or controllers. In one or more embodiments, the controller 144 is communicatively coupled to dedicated controllers, and the controller 144 functions as a central controller.

The controller 144 is of any form of a general-purpose computer processor that is used in an industrial setting for controlling various substrate processing chambers and equipment, and sub-processors thereon or therein. The memory 140, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits 142 of the controller 144 are coupled to the CPU 138 for supporting the CPU 138 (a processor). The support circuits 142 can include cache, power supplies, clock circuits, input/output circuitry and subsystems, and the like. Operational parameters (such as the heating period, the target heating temperature, the cooling period, the target cooling temperature, and/or the thermal condition described below) and operations are stored in the memory 140 as software routine(s) that are executed or invoked to turn the controller 144 into a specific purpose controller to control the operations of the various systems/chambers/units/modules described herein. The software routine(s), when executed by the CPU 138, transform the CPU 138 into a specific purpose computer. The software routines may also be stored and/or executed by a second controller (not shown) that is located remotely from the system 100.

The controller 144 is configured to conduct any of the operations described herein. In one or more embodiments, the instructions stored on the memory, when executed, cause one or more of operations of method 1000 and/or the method 1050 (described below) to be conducted.

The various operations described herein can be conducted automatically using the controller 144, or can be conducted automatically and/or manually with certain operations conducted by a user.

In one or more embodiments, the controller 144 is configured to conduct operations described herein using a sequencer with closed loop control. In one or more embodiments, the controller 144 uses open loop control and is configured to adjust output to controls of the system 100 based on sensor readings, a system model, and stored readings and calculations. As an example, one or more operating parameters can be measured by one or more thermal sensors positioned along the system 100 and described herein. The controller 144 includes embedded software and a compensation algorithm to calibrate measurements. The controller 144 can include one or more machine learning algorithms and/or artificial intelligence algorithms that estimate optimized parameters for deposition operation(s), transfer operation(s), pre-heating operation(s), pre-cooling operation(s), cleaning operations, and/or etching operations. The one or more machine learning algorithms and/or artificial intelligence algorithms can use, for example, a regression model (such as a linear regression model) or a clustering technique to estimate optimized parameters. The algorithm can be unsupervised or supervised. As an example, the one or more machine learning algorithms and/or artificial intelligence algorithms can be used in operations 1019, 1023 of the method 1000 and/or operations 1025, 1028 of the method 1050 below to detect thermal shock (e.g., deformation) of the substrate and/or the substrate holder and adjust one or more parameters of the pre-heating of operation 1004 and/or the pre-cooling of operation 1014. For example, the heating period and/or the target heating temperature (that are used in the previous cycle and stored) can be adjusted for optimization.

The one or more machine learning algorithms and/or artificial intelligence algorithms can optimize the operating parameters used in relation to operations described herein.

Figure 2:
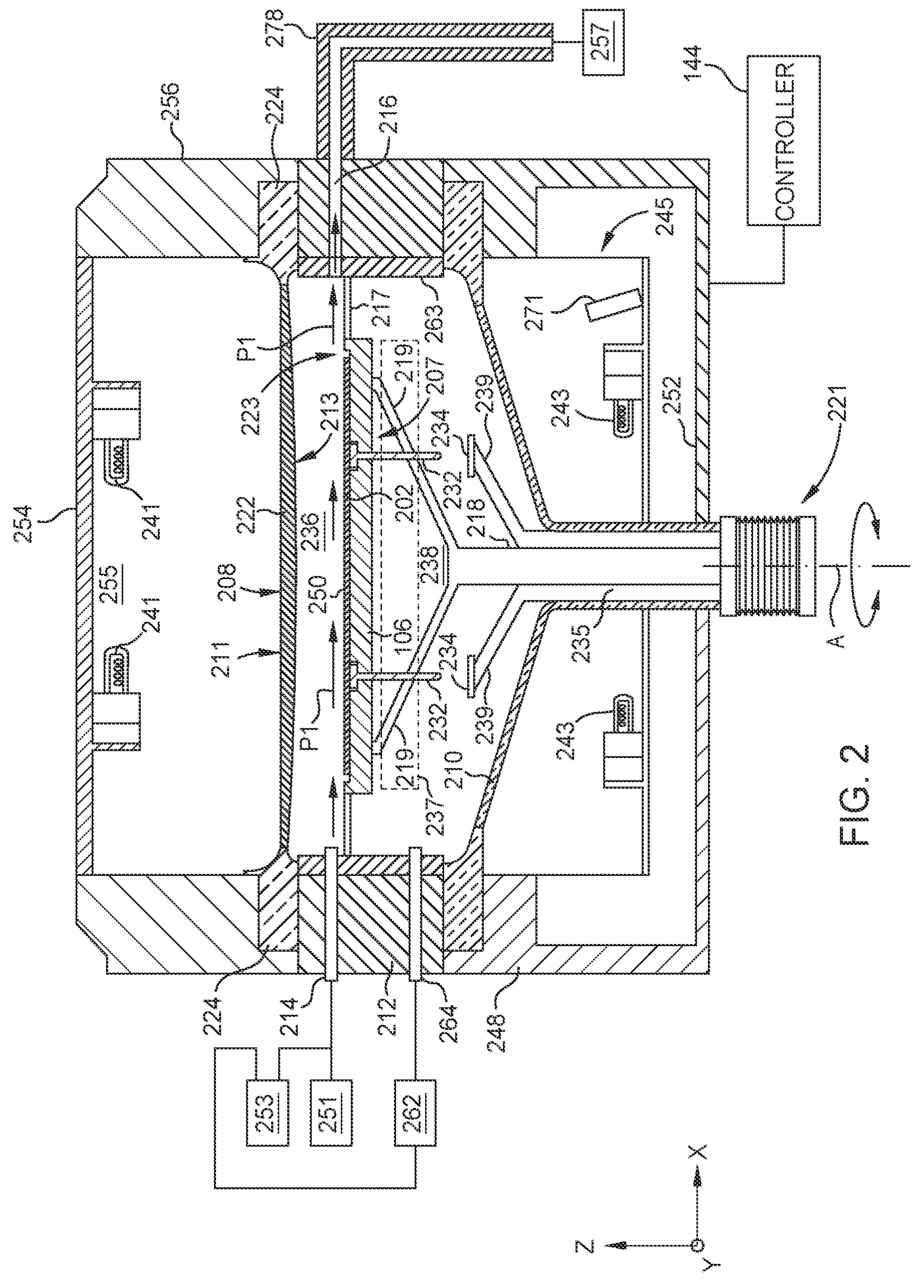
FIG. 2 is a schematic side cross-sectional view of a processing chamber, according to one implementation.

FIG. 2 is a schematic side cross-sectional view of a processing chamber 200, according to one implementation. The processing chamber 200 is a deposition chamber. In one or more embodiments, the processing chamber 200 is an epitaxial deposition chamber. The processing chamber 200 is utilized to grow an epitaxial film on a substrate 202. The processing chamber 200 creates a cross-flow of precursors across a top surface 250 of the substrate 202.

The processing chamber 200 can be used as one or more of the processing chambers 110, 112, 128 shown in FIG. 1. In one or more embodiments, a processing chamber 120 conducts processing (such as pre-cleaning or etching) at a temperature (such as an ambient temperature, for example a room temperature) that is lower than a processing temperature used in the processing chamber 200.

The processing chamber 200 includes an upper body 256, a lower body 248 disposed below the upper body 256, and a flow module 212 disposed between the upper body 256 and the lower body 248. The upper body 256, the flow module 212, and the lower body 248 form a chamber body. Disposed within the chamber body is a substrate support 206, an upper window 208 (such as an upper dome), a lower window 210 (such as a lower dome), a plurality of upper heat sources 241, and a plurality of lower heat sources 243. As shown, the controller 144 is in communication with the processing chamber 200 and is used to control processes and methods of at least the processing chamber 200.

In the implementation shown in FIG. 1, the heat sources 241, 243 are lamps. Other heat sources are contemplated, such as resistive heaters, light emitting diodes (LEDs), and/or lasers. Other heat sources are contemplated.

The substrate support 206 is disposed between the upper window 208 and the lower window 210. The substrate support 206 includes a support face 223 that supports the substrate 202. The plurality of upper heat sources 241 are disposed between the upper window 208 and a lid 254. The plurality of upper heat sources 241 form a portion of the upper heating module 255.

The processing chamber 200 includes one or more thermal sensors 271 configured to detect a thermal condition. In one or more embodiments, the one or more thermal sensors 271 can include one or more cameras, one or more pyrometers, one or more thermoelectric sensors, and/or one or more thermal labels. The one or more thermal sensors 271 can be mounted, for example, below the lower window 210 (as shown in FIG. 2), above the upper window 208 (such as on or in the lid 254), above the window 305 or in the internal volume 301 shown in FIGS. 3 and 4. Other mounting locations for the one or more thermal sensors 271 (such as on or to the load lock chambers and/or on or to the processing chamber 120) are contemplated.

The lid 254 may include one or more of sensors (such as pyrometers) disposed therein or thereon for measuring a temperature within the processing chamber 200. The plurality of lower heat sources 243 are disposed between the lower window 210 and a chamber floor 252. The plurality of lower heat sources 243 form a portion of a lower heating module 245. The upper window 208 is an upper dome and is formed at least partially of an energy transmissive material, such as quartz. The lower window 210 is a lower dome and is formed at least partially of an energy transmissive material, such as quartz.

A process volume 236 and a purge volume 238 are positioned between the upper window 208 and the lower window 210. The process volume 236 and the purge volume 238 are part of an internal volume defined at least partially by the upper window 208, the lower window 210, and the one or more liners 263. The upper window 208 at least partially defines the process volume 236.

The upper window 208 includes a first face 211 that is concave or flat (in the implementation shown in FIG. 2, the first face 211 is flat). The upper window 208 includes a second face 213 that is convex. The second face 213 faces the substrate support 206. The present disclosure contemplates other shapes for the upper window 208. The upper window 208 includes an inner section 222 and an outer section 224. The first face 211 and the second face 213 are at least part of the inner section 222. The inner section 222 is transparent and the outer section 224 is opaque. The outer section 224 is received at least partially in one or more sidewalls (such as in the flow module 212) of the processing chamber 200.

The internal volume has the substrate support 206 disposed therein. The substrate support 206 includes a top surface on which the substrate 202 is disposed. The substrate support 206 is coupled to a shaft 218. The shaft 218 is connected to a motion assembly 221. The motion assembly 221 includes one or more actuators and/or adjustment devices that provide movement and/or adjustment for the shaft 218 and/or the substrate support 206 within the processing volume 236. In one or more embodiments, the substrate support 206 is coupled to the shaft 218 through one or more arms 219 coupled to the shaft 218.

The substrate support 206 may include lift pin holes 207 disposed therein. The lift pin holes 207 are each sized to accommodate a lift pin 232 for lifting of the substrate 202 from the substrate support 206 either before or after a deposition process is conducted. The lift pins 232 may rest on lift pin stops 234 when the substrate support 206 is lowered from a process position to a transfer position. The lift pin stops 234 can include a plurality of arms 239 that are coupled to a second shaft 235.

The flow module 212 includes a plurality of gas inlets 214, a plurality of purge gas inlets 264, and one or more gas exhaust outlets 216. The plurality of gas inlets 214 and the plurality of purge gas inlets 264 are disposed on the opposite side of the flow module 212 from the one or more gas exhaust outlets 216. One or more flow guides 217 are disposed below the plurality of gas inlets 214 and the one or more gas exhaust outlets 216. The one or more flow guides 217 can include, for example, one or more pre-heat rings. The one or more flow guides 217 are disposed above the purge gas inlets 264. One or more liners 263 are disposed on an inner surface of the flow module 212 and protects the flow module 212 from reactive gases used during deposition operations and/or cleaning operations. The gas inlet(s) 214 and the purge gas inlet(s) 264 are each positioned to flow a gas parallel to the top surface 250 of a substrate 202 disposed within the process volume 236. The gas inlet(s) 214 are fluidly connected to one or more process gas sources 251 and one or more cleaning gas sources 253. The purge gas inlet(s) 264 are fluidly connected to one or more purge gas sources 262 and/or the one or more cleaning gas sources 253. The one or more gas exhaust outlets 216 are fluidly connected to an exhaust pump 257. One or more process gases supplied using the one or more process gas sources 251 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). One or more purge gases supplied using the one or more purge gas sources 262 can include one or more inert gases (such as one or more of argon (Ar), helium (He), hydrogen ($H_2$), and/or nitrogen ($N_2$)). One or more cleaning gases supplied using the one or more cleaning gas sources 253 can include one or more of hydrogen (H) and/or chlorine (Cl). In one or more embodiments, the one or more process gases include silicon phosphide (SiP) and/or phosphine ($PH_3$), and the one or more cleaning gases include hydrochloric acid (HCl).

The one or more gas exhaust outlets 216 are connected to or include an exhaust system 278. The exhaust system 278 fluidly connects the one or more gas exhaust outlets 216 and the exhaust pump 257. The exhaust system 278 can assist in the controlled deposition of a layer on the substrate 202. The exhaust system 278 is disposed on an opposite side of the processing chamber 200 relative to the flow module 212.

Substrates (such as the substrate 202) are transferred into and out of the internal volume of the processing chamber 200, and from or to an internal volume of the transfer chamber 136, through a transfer door 237 (such as a slit valve). When the transfer door 237 is open, a substrate holder (with a substrate supported thereon) can extend into the internal volume through the transfer door 237 such that the lift pins 232 can lift the substrate from the substrate holder and land the substrate on the substrate support 206 for processing. After processing, the lift pins 232 can lift the substrate from the substrate support 206 and land the substrate on the substrate holder, and the substrate holder can be retracted through the open transfer door 237 to remove the substrate from the processing chamber 200.

Figure 3:
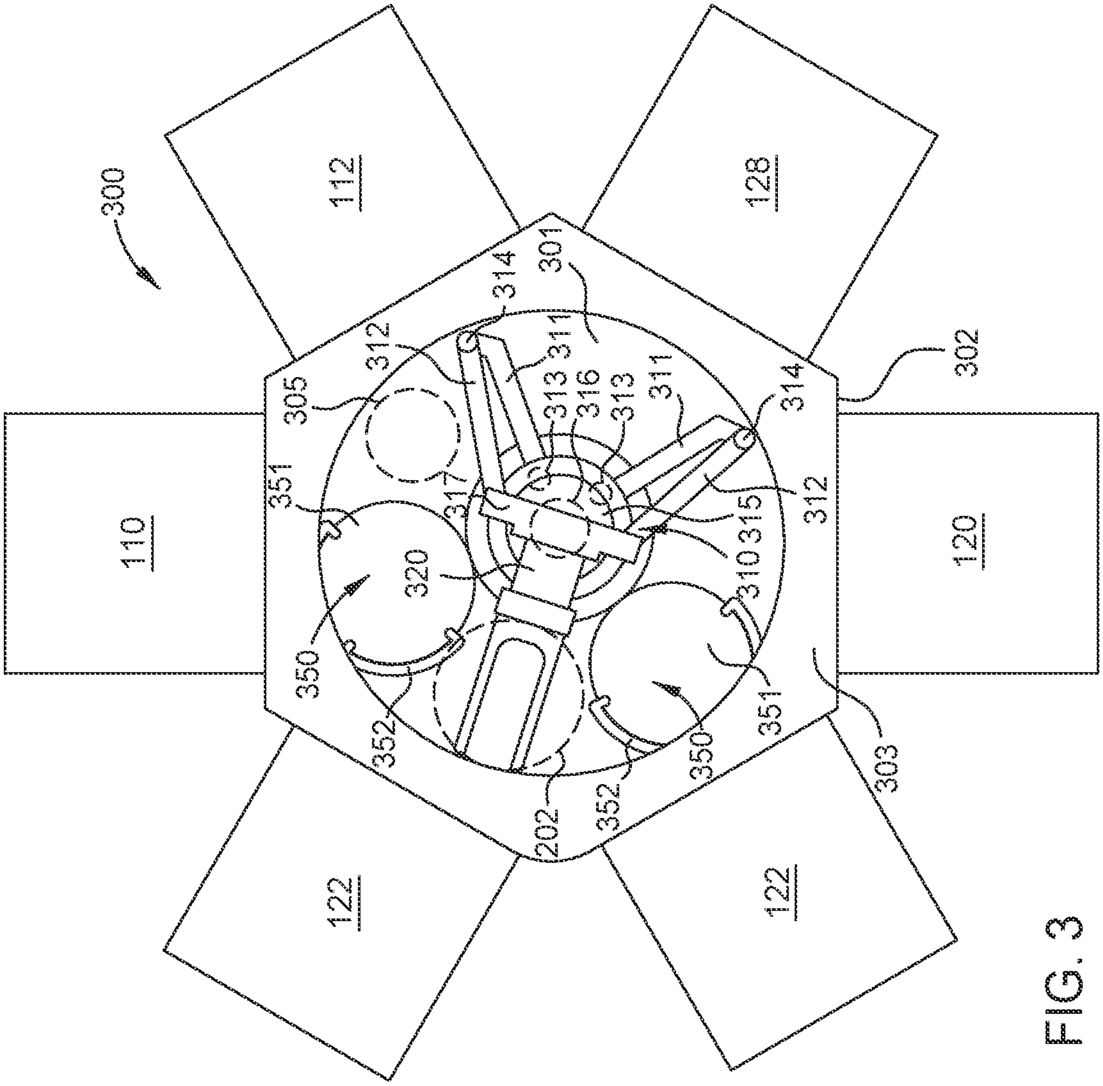
FIG. 3 is a schematic partial top view of a transfer chamber, according to one or more embodiments.

FIG. 3 is a schematic partial top view of a transfer chamber 300, according to one or more embodiments. The transfer chamber 300 can be used as the transfer chamber 136 shown in FIG. 1.

The transfer chamber 300 includes an internal volume 301, and one or more sidewalls 302 at least partially defining the internal volume 301. The view of the transfer chamber 300 shown in FIG. 3 is a view where a lid 304 (shown in FIG. 4) is removed and not shown in FIG. 3. The lid 304 can be coupled to one or more upper surfaces 303 of the one or more sidewalls 302 to cover the internal volume 301.

The transfer chamber 300 includes a transfer apparatus 310 disposed in the internal volume 301. In one or more embodiments, the transfer apparatus 310 is a transfer robot. The transfer apparatus 310 includes one or more links 311, 312, one or more motors 313 configured to pivot the one or more links 311, 312, and one or more substrate holders 320 coupled to the one or more links 311, 312. The one or more substrate holders 320 are coupled to the one or more links 311, 312 through a support bar 317 coupled to the one or more links 311, 312. A first set of links 311 are coupled to a second set of links 312 using pivot pins 314. The first set of links 311 are coupled to a rotatable base 315, and a base motor 316 is configured to rotate the rotatable base 315. A rotor of the base motor 316 can be rotated to rotate the rotatable base 315 to rotate the transfer apparatus 310. The rotation of the transfer apparatus 310 moves the substrate 202 along an arcuate path and adjusts a circumferential position of the substrate 202. Rotor(s) of the one or more motors 313 can be rotated to pivot the first set of links 311 and in turn, pivot the second set of links 312 through the pivot pins 314. The pivoting of the first and second sets of links 311, 312 linearly extends or retracts the support bar 317 and the one or more substrate holders 320 to adjust a radial position of the substrate 202 that is supported by the one or more substrate holders 320.

The transfer chamber 300 includes one or more cooling stations 350 (two are shown in FIG. 3) disposed in the internal volume 301. Each of the one or more cooling stations 350 includes a support frame 351 and one or more lift devices 352. The one or more cooling stations 350 can be used in relation to one or more pre-cooling operations. A window 305 (described in FIG. 4) and the one or more cooling stations 350 are aligned radially between the rotatable base 315 and the one or more sidewalls 302 of the transfer chamber 300.

Figure 4:
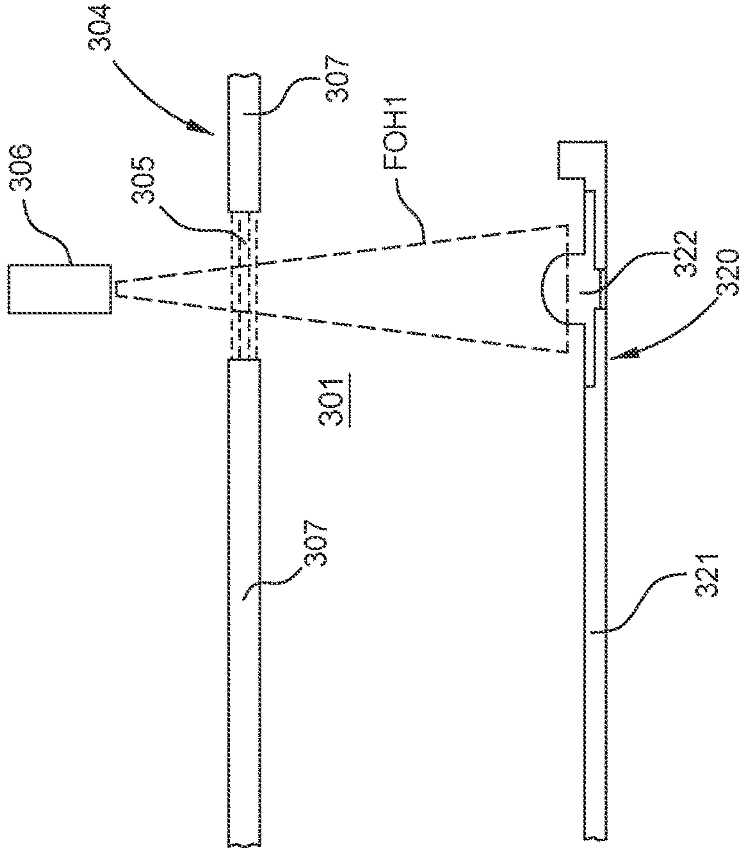
FIG. 4 is a schematic partial side view of the transfer chamber shown in FIG. 3, according to one or more embodiments.

FIG. 4 is a schematic partial side view of the transfer chamber 300 shown in FIG. 3, according to one or more embodiments.

The transfer chamber 300 includes a window 305 that includes a transparent material. In one or more embodiments, the transparent material is transmissive for at least 80% (such as 90% or more, for example 95% or more) of energy (e.g., light) having a wavelength in the infrared range. In one or more embodiments, the transparent material includes quartz ($SiO_2$). Other materials are contemplated for the transparent material. The transfer chamber 300 includes one or more heat sources 306 configured to direct heat into the internal volume 301 through the window 305 and along one or more fields of heating FOH1 of the one or more heat sources 306. In one or more embodiments, the window 305 is at least part of the lid 304. Other portions 307 of the lid 304—if present—can include a metallic material (e.g., aluminum and/or stainless steel). During a pre-heat operation, the substrate holder 320 is moved to align with the one or more fields of heating FOH1. In one or more embodiments, at least one of a plurality of substrate supports 322 of the substrate holder 320 are aligned with the one or more fields of heating FOH1. In one or more embodiments, the one or more heat sources 306 are configured to emit energy (such as light) having a wavelength in the infrared (IR) range. The one or more heat sources 306 include one or more lamps, resistive heaters, light emitting diodes (LEDs), and/or lasers. Other heat sources are contemplated. In one or more embodiments, the one or more heat sources 306 include lamp(s) and structure(s) (such as aperture(s), lens(es), and/or reflector(s)) that direct the emitted energy along the one or more fields of heating FOH1. For example, the one or more heat sources 306 can include spot-heating lamps. In one or more embodiments, the one or more heat sources 306 include LED(s) and/or laser(s), and structure(s) (such as aperture(s), lens(es), and/or reflector(s)) that direct the emitted energy along the one or more fields of heating FOH1.

The present disclosure contemplates that the one or more heat sources 306 can simultaneously heat all of the substrate supports 322, or can sequentially heat (e.g., by moving the substrate holder 320) the substrate supports 322 until all of the substrate supports 322 are heated to a target temperature. The present disclosure also contemplates that some of the substrate supports 322 can be heated simultaneously or sequentially.

Figure 5:
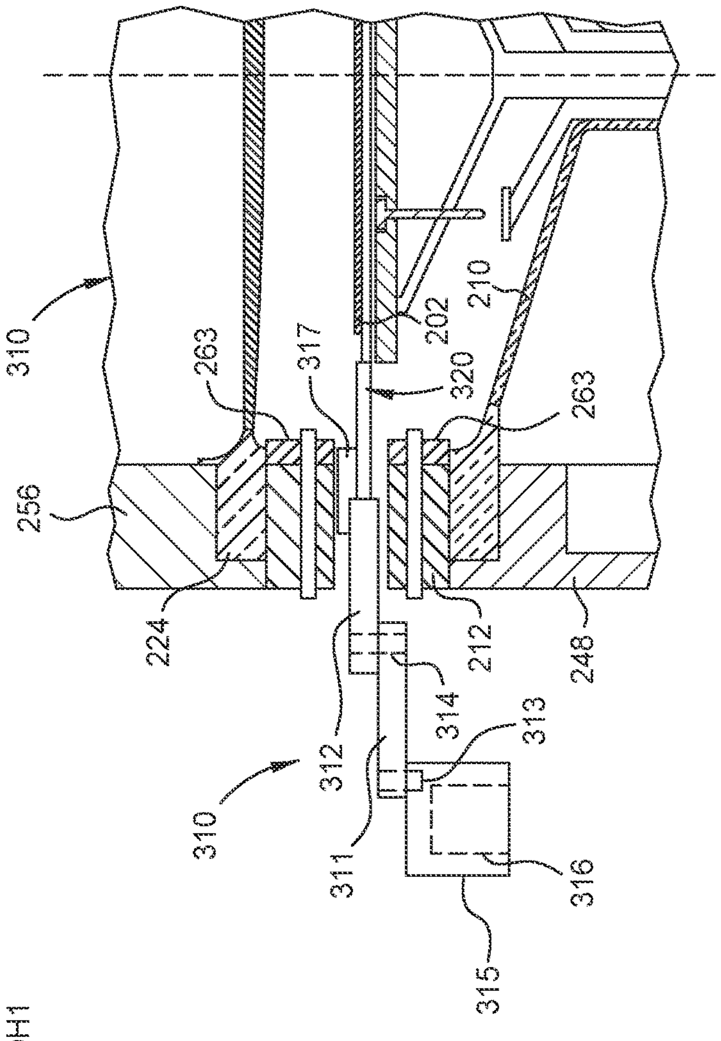
FIG. 5 is a schematic partial side view of the transfer apparatus shown in FIG. 3 extended into the processing chamber shown in FIG. 2, according to one or more embodiments.

FIG. 5 is a schematic partial side view of the transfer apparatus 310 shown in FIG. 3 extended into the processing chamber 200 shown in FIG. 2, according to one or more embodiments.

The rotor(s) of the one or more motors 313 are rotated to pivot the first set of links 311 and actuate the links 311, 312 to extend the one or more substrate holders 320 into the processing chamber 200. The substrate 202 supported by the one or more substrate holders 320 can be lifted off of the one or more substrate holders 320 and lowered onto the substrate support 206 (shown in FIG. 2).

Figure 6:
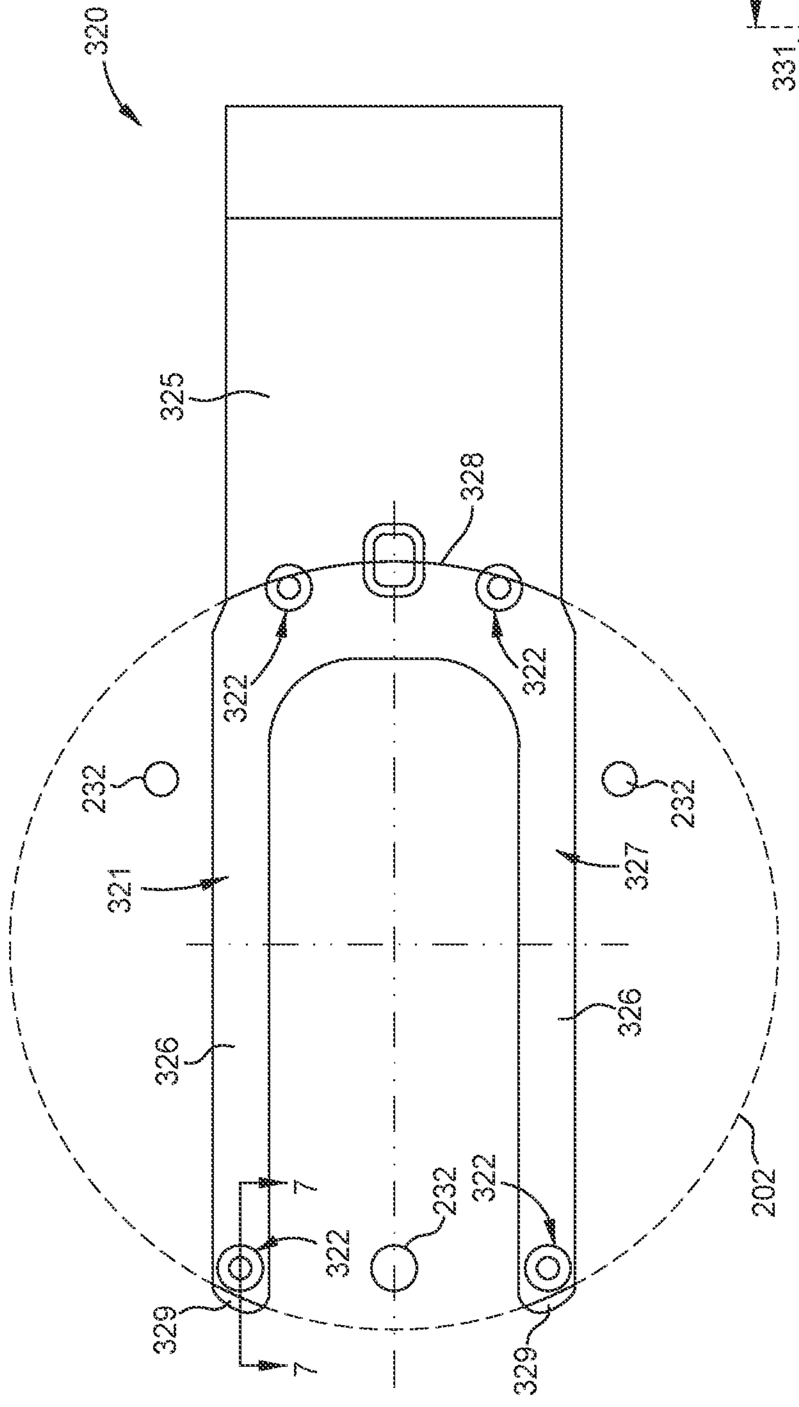
FIG. 6 is a schematic top view of the substrate holder shown in FIG. 3, for moving a substrate in relation to semiconductor manufacturing, according to one or more embodiments.

FIG. 6 is a schematic top view of the substrate holder shown in FIG. 3, for moving a substrate 202 in relation to semiconductor manufacturing, according to one or more embodiments.

Figure 7:
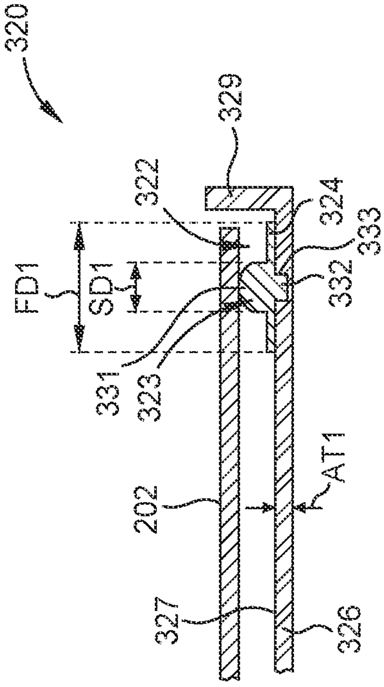
FIG. 7 is a schematic side cross-sectional view of the transfer chamber, along Section 7-7 shown in FIG. 6, according to one or more embodiments.

FIG. 7 is a schematic side cross-sectional view of the transfer chamber 300, along Section 7-7 shown in FIG. 6, according to one or more embodiments.

The substrate holder 320 includes a body 321, and the plurality of substrate supports 322 are inserted at least partially into the body 321. In one or more embodiments, the body 321 is a blade, for example a robot blade. Each of the plurality of substrate supports 322 includes an inner segment 323 and one or more fins 324 extending outwardly relative to the inner segment 323. In the implementation shown in FIG. 6, the substrate holder 320 includes four substrate supports 322. Other numbers of substrate supports 322 are contemplated.

The body 321 includes a wrist 325, and a plurality of arms 326 defining a support face 327. The plurality of arms 326 are each formed of an arm material. The substrate supports 322 are inserted at least into the support face 327 of the body 321. The wrist 325 includes a wrist ledge 328, each of the plurality of arms 326 includes an arm ledge 329, and each of the plurality of substrate supports 322 is positioned inwardly of the wrist ledge 328 and each arm ledge 329. The plurality of arms 326 have an arm thickness AT1.

Each of the inner segment 323 and the one or more fins 324 includes silicon carbide (SiC). In one or more embodiments, each of the inner segment 323 and the one or more fins 324 is formed of the SiC. In one or more examples, each of the inner segment 323 and the one or more fins 324 has a composition that is at least 95% silicon and carbon by atomic percentage. In one or more embodiments, each of the inner segment 323 and the one or more fins 324 is formed of graphite coated with the SiC. In one or more embodiments, each of the plurality of substrate supports 322 is formed of a support material that is different than the arm material. In one or more embodiments, the arm material includes quartz ($SiO_2$), such as transparent quartz. In one or more embodiments, the arm material is transmissive for at least 80% (such as 90% or more, for example 95% or more) of energy (e.g., light) having a wavelength in the infrared (IR) range. In one or more embodiments, the support material has an absorptivity that absorbs at least 80% (such as 90% or more, for example 95% or more) of light having a wavelength in the infrared (IR) range. In one or more embodiments, the support material has a thermal conductivity that is at least 100 W/m*° K. In one or more embodiments, the support material has an electrical resistivity that is 1.0 Mega-Ohm or higher, such as 2.0 Mega-Ohms or higher.

The substrate supports 322 can be formed by machining a solid block of SiC. The substrate supports 322 can be formed by injection molding graphite, and coating the molded graphite with SiC. Other methods of forming the substrate supports 322 are contemplated.

In the implementation shown in FIG. 7, the inner segment 323 is semi-ball shaped (such as semi-spherical in shape or semi-ovular in shape) and cylindrical in shape, and each of the one or more fins 324 is cylindrical or rectangular in shape. In the implementation shown in FIG. 6, each of the one or more fins 324 is cylindrical in shape.

Each of the inner segments 323 includes a support portion 331 on a first side of the one or more fins 324. The inner segment 323 of each substrate support 322 has a segment major dimension SD1 and each of the one or more fins 324 has a fin major dimension FD1. The fin major dimension FD1 is larger than the segment major dimension SD1.

Each of the inner segments 323 includes an insertion portion 332 on a second side of the one or more fins 324. The insertion portion 332 extends into a retention opening 333 formed in one of the plurality of arms 326. In the implementations shown in FIGS. 6 and 7, the insertion portion 332 is cylindrical in shape, and the support portion 331 includes a first section that is cylindrical in shape and a second section (contacting and supporting the substrate 202) that is semi-ball shaped (such as semi-spherical in shape or semi-ovular in shape). In the implementation shown in FIGS. 6 and 7, the one or more fins 324 rest on the support face 327 of the body 321.

The substrate holder 320 (such as the body 321 and/or the substrate supports 322) can include, for example, any of the subject matter described and/or shown for any of the transfer apparatus and/or any of the substrate supports in co-pending U.S. patent application Ser. No. 17/991,540, filed on Nov. 21, 2022.

Figure 8:
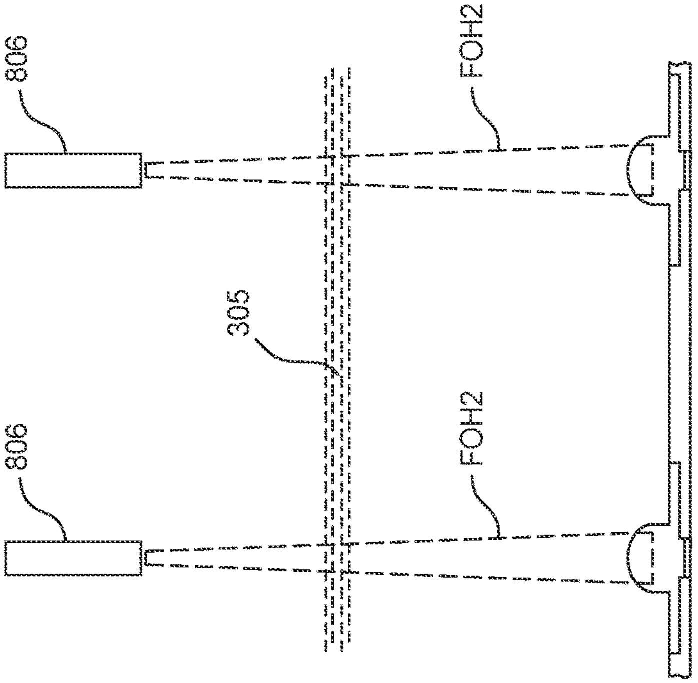
FIG. 8 is a schematic partial side view of the transfer chamber shown in FIG. 3, according to one or more embodiments.

FIG. 8 is a schematic partial side view of the transfer chamber 300 shown in FIG. 3, according to one or more embodiments.

In the implementation shown in FIG. 8, the transfer chamber 300 includes a plurality of heat sources 806 that include a plurality of fields of heating FOH2. The fields of heating FOH2 have an angle of inclination (e.g., extending from a longitudinal center axis to an outer diameter) that is smaller than an angle of inclination of the one or more fields of heating FOH1 such that the fields of heating FOH2 are narrower than the one or more fields of heating FOH1. The heat sources 806 can include spot-heating lasers.

Figure 9:
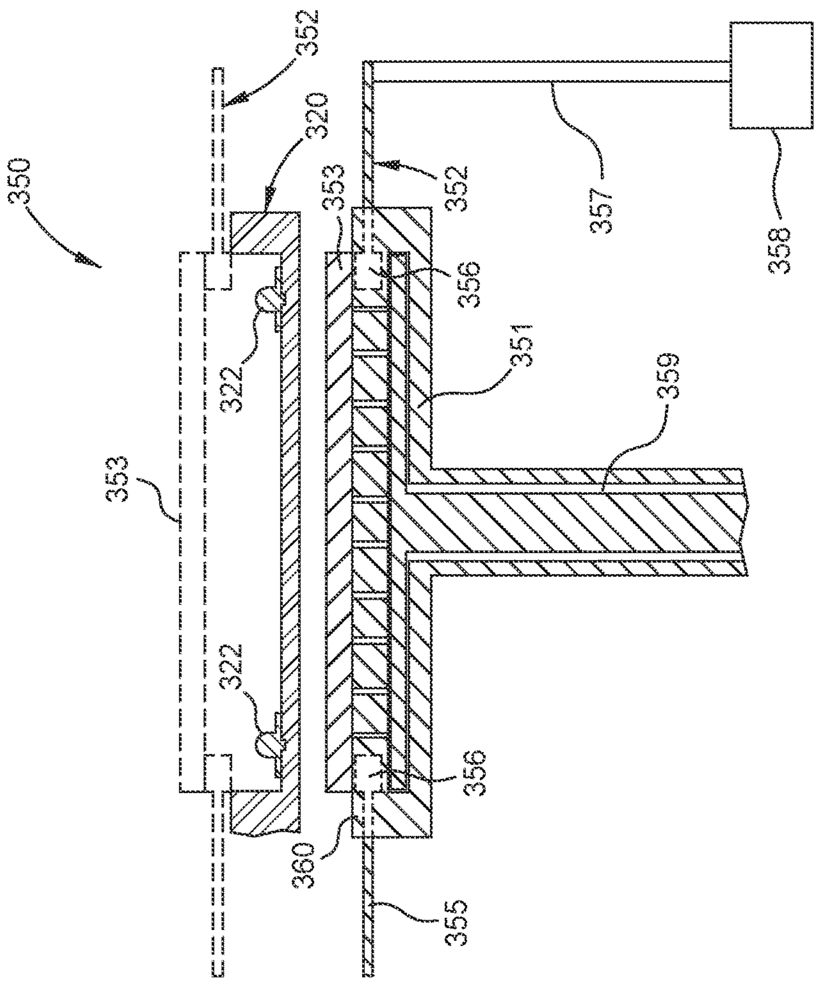
FIG. 9 is a schematic partial side cross-sectional view of one of the one or more cooling stations shown in FIG. 3, according to one or more embodiments.

FIG. 9 is a schematic partial side cross-sectional view of one of the one or more cooling stations 350 shown in FIG. 3, according to one or more embodiments.

Each of the one or more cooling stations 350 includes a cooling substrate 353 supported by the support frame 351. The one or more lift devices 352 are configured to raise and lower the cooling substrate 353 relative to the support frame 351. The support frame 351 can include, for example, a susceptor. Other support frames, such as one or more arcuate ring segments, are contemplated. The cooling substrate 353 is supported by the support frame 351 for a time period in between pre-cooling operation cycles that cool the substrate holder 320. The time period is within a range of 30 seconds to 150 seconds, such as about 60 seconds.

The one or more lift devices 352 include one or more arcuate ring segments 355 and a plurality of ledges 356 extending inwardly relative to the one or more arcuate ring segments 355. The one or more lift devices 352 include a support link 357 and one or more motors 358 configured to linearly move the support link 357 to raise and/or lower the one or more arcuate ring segments 355.

The motors discussed herein can be, for example, electric motors. Other motors (such as hydraulic motors and/or pneumatic motors) can be used.

The cooling substrate 353 includes silicon carbide (SiC). In one or more embodiments, the cooling substrate 353 is formed of SiC coated with graphite. The cooling substrate 353 has a substrate thickness ST1 that is larger than the arm thickness AT1 of the arms 326. In one or more embodiments, the body 321 of the substrate holder 320 has a first thermal conductivity that is lesser than a second thermal conductivity of the cooling substrate 353. In one or more embodiments, the second thermal conductivity of the cooling substrate 353 is equal to or larger than the thermal conductivity of the substrate supports 322. In one or more embodiments, the second thermal conductivity is at least 100 W/m*° K, such as at least 150 W/m*° K, for example at least 200 W/m*° K. In one or more embodiments, the cooling substrate 353 is disc-shaped.

As shown in ghost in FIG. 9, the one or more lift devices 352 can be used to raise the cooling substrate 353 relative to the support frame 351 such that the substrate holder 320 can be extended under the cooling substrate 353. The one or more lift devices 352 can used to lower the cooling substrate 353 onto the substrate supports 322 of the substrate holder 320 for a cooling period during a pre-cooling operation. The pre-cooling operation can be used to transfer heat from the substrate holder 320 and to the cooling substrate 353 to cool the substrate holder 320 prior to using the substrate holder 320 to transfer a substrate that is cooler than the substrate holder 320 prior to the pre-cooling operation. The substrate can be, for example, stored in one of the load lock chambers 122 or disposed in the processing chamber 120 (e.g., after a pre-clean operation or an etch operation is conducted on the substrate).

In one or more embodiments, the support frame 351 includes one or more cooling channels 359 formed therein. A cooling fluid (such as air and/or water, for example) can flow through the one or more cooling channels 359 to cool the support frame 351 and/or the cooling substrate 353 while the cooling substrate is supported by the support frame 351. For example, the cooling fluid can flow before, during, and/or after the one or more lift devices 352 are used to lower the cooling substrate 353 back onto the support frame 351 after the cooling substrate 353 is used to cool the substrate holder 320. In one or more embodiments, portions of the one or more cooling channels can extend to a support surface 360 of the support frame 351 such that the cooling fluid is directed to a backside surface of the cooling substrate 353. In one or more embodiments (such as when water is used for the cooling fluid), the portions are omitted such that the cooling substrate 353 is fluidly isolated from the cooling fluid.

Figure 10A:
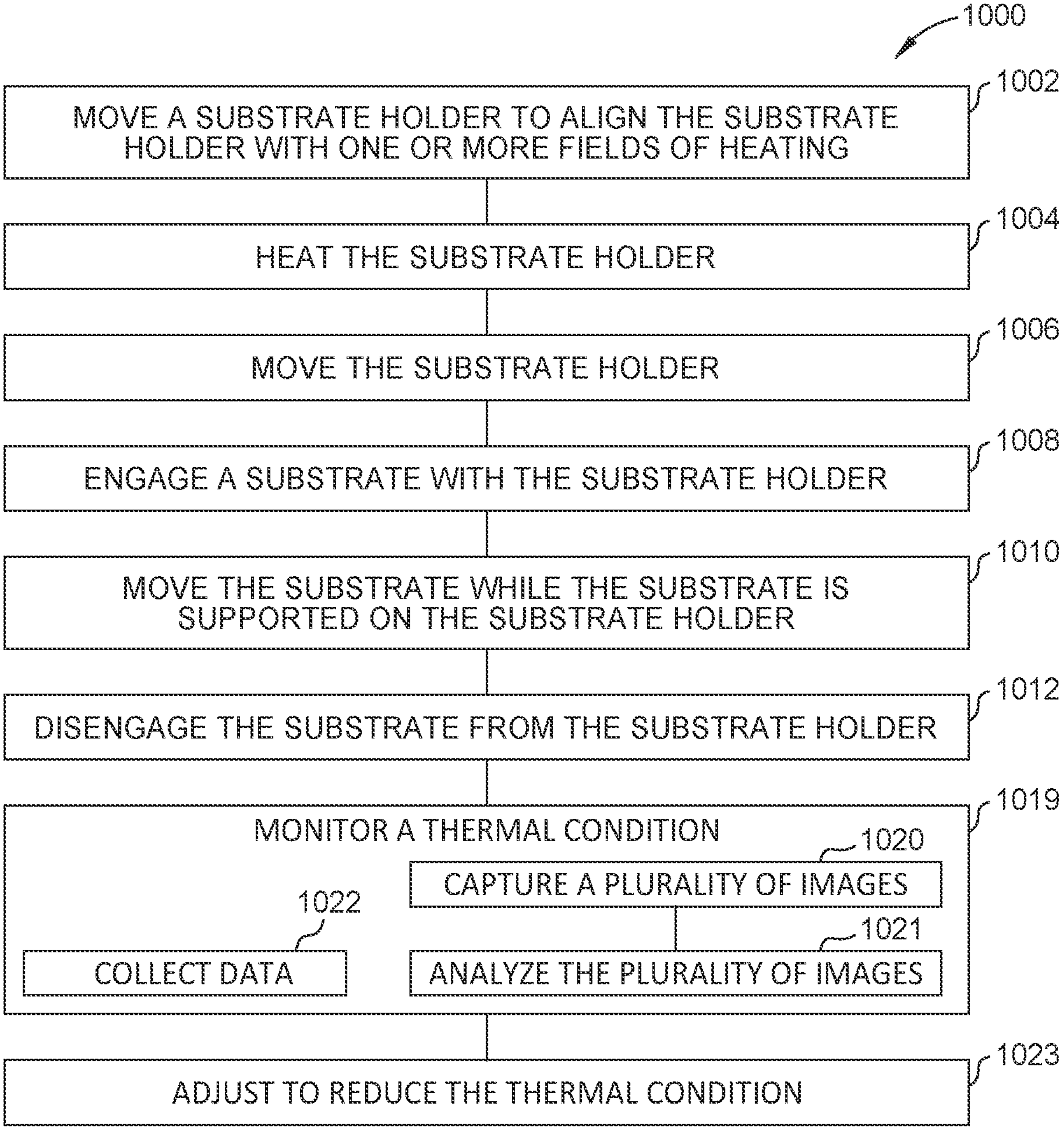
FIG. 10A is a schematic block diagram view of a method of substrate transfer applicable for semiconductor manufacturing, according to one or more embodiments.

FIG. 10A is a schematic block diagram view of a method 1000 of substrate transfer applicable for semiconductor manufacturing, according to one or more embodiments.

Operation 1002 includes moving a substrate holder to align the substrate holder with one or more fields of heating of one or more heat sources. In one or more embodiments, at least one substrate support (such as one or all of a plurality of substrate supports) of the substrate holder is aligned with the one or more fields of heating. In one or more embodiments, at least one contact section of the substrate holder that is configured to contact a substrate (such as one or all of a plurality of contact sections that are configured to contact the substrate) is aligned with the one or more fields of heating.

Operation 1004 includes heating at least a portion of the substrate holder for a heating period to a target heating temperature using the one or more heat sources. Operation 1004 can be referred to as a pre-heating operation. The heating can include powering the one or more heat sources. In one or more embodiments, the at least one substrate support (such as one or all of the plurality of substrate supports) of the substrate holder is heated to the target heating temperature. In one or more embodiments, the at least one contact section of the substrate holder (such as one or all of a plurality of contact sections) is heated to the target heating temperature. The target heating temperature is within a range of 300 degrees Celsius to 1,500 degrees Celsius or higher, such as within a range of 450 degrees Celsius to 800 degrees Celsius. In one or more embodiments, the target heating temperature is within a range of 550 degrees Celsius to 650 degrees Celsius, such as about 600 degrees Celsius.

Operation 1006 includes, after the heating of the substrate holder to the target heating temperature, moving the substrate holder into an internal volume of a processing chamber. In one or more embodiments, the processing chamber is a deposition chamber, such as an epitaxial deposition chamber.

Operation 1008 includes engaging a substrate in the internal volume with the substrate holder.

Operation 1010 includes moving the substrate out of the processing volume while the substrate is supported on the substrate holder.

Operation 1012 includes disengaging the substrate from the substrate holder.

Operation 1019 includes monitoring a thermal condition. In one or more embodiments, the thermal condition is of one or more of the substrate and/or the substrate holder. In one or more embodiments, the thermal condition is of one or more of the substrate and/or the substrate holder.

In one or more embodiments, the thermal condition includes a difference between a substrate temperature and the target heating temperature, and the substrate temperature is a temperature of the substrate prior to the engaging (operation 1008) of the substrate with the substrate holder. The substrate temperature can be, for example, a temperature of the substrate after processing, such as epitaxial deposition processing.

In one or more embodiments, the thermal condition includes a return time in which a deformation of the substrate is reduced to a specified level. The deformation (e.g., bowing) can be caused, for example, by the substrate engaging (operation 1008) with the substrate holder. In one or more embodiments, the specified level is a level before the substrate engages (operation 1008) with the substrate holder.

In one or more embodiments, operation 1020 of the monitoring includes capturing a plurality of images. In one or more embodiments, the plurality of images are captured while the substrate is engaged with the substrate holder. The images can be images of the substrate holder and/or the substrate. The images can be images of other components (such as chamber walls and/or reflectors) that include light reflected from the substrate holder and/or the substrate.

In one or more embodiments, operation 1021 of the monitoring includes analyzing the plurality of images to extract information. In one or more embodiments, a physical profile of the images is analyzed. The physical profile can be of, for example, the substrate and/or the substrate holder. In one or more embodiments, an intensity (such as a pixel concentration of light) of the images is analyzed. The light can be, for example, light of a heating glow (e.g., an orange glow) of the substrate and/or the substrate holder. The light can be, for example, light from the substrate and/or the substrate holder that is reflecting off of another component (such as a chamber wall, a chamber lid, and/or a reflector). In one or more embodiments, one or more colors of the images are analyzed. The one or more colors can be, for example, the one or more colors of a heating glow (e.g., an orange glow) of the substrate and/or the substrate holder. The one or more colors can be, for example, the one or more colors of one or more thermal labels attached (e.g., using adhesive) to the substrate and/or the substrate holder. The one or more thermal labels are configured to change to one or more different colors at one or more different temperatures.

In one or more embodiments, the information indicates the deformation of the substrate and/or the return time of the substrate. In one or more embodiments, the information indicates the difference between the substrate temperature and the target heating temperature.

In place of or in addition to operations 1020, 1021, operation 1022 of the monitoring includes collecting data from one or more other thermal sensors. In one or more embodiments, the one or more other thermal sensors include one or more thermoelectric sensors. The one or more thermoelectric sensors can be attached to one or more of the substrate and/or the substrate holder. The one or more thermoelectric sensors can be supported by, for example, the substrate supports 322 of the substrate holder 320 (e.g., in place of the substrate 202 and in a shape similar to the shape of the substrate 202). The one or more thermoelectric sensors are in wireless communication with the controller 144. The one or more thermoelectric sensors include one or more thermocouples and use a change in electrical voltage therein to determine a temperature change of one or more of the substrate and/or the substrate holder.

Other thermal sensors are contemplates for operation 1022, such as one or more pyrometers that measure intensity of lasers reflected off of one or more of the substrate and/or the substrate holder.

Operation 1023 of the method 1000 includes adjusting one or more of the heating period and/or the target heating temperature to reduce the thermal condition. In one or more embodiments, the adjusting of the target heating temperature includes adjusting a time of the heating period and/or a heating power of the heating period.

The present disclosure contemplates that the operations of operation 1019 and/or operation 1023 can be conducted as part of a calibration operation for the pre-heating of operation 1004.

For example, while operation 1004 is conducted, operation 1019 can be conducted with a "holder temperature" of the substrate holder used in place of the "substrate temperature" in operation 1019 to facilitate ensuring that the substrate holder is heated to the target heating temperature. If applicable, operation 1023 can include adjusting the target heating temperature to an adjusted target heating temperature based on the conduction of operation 1019 using the "holder temperature in place of the "substrate temperature."

Figure 10B:
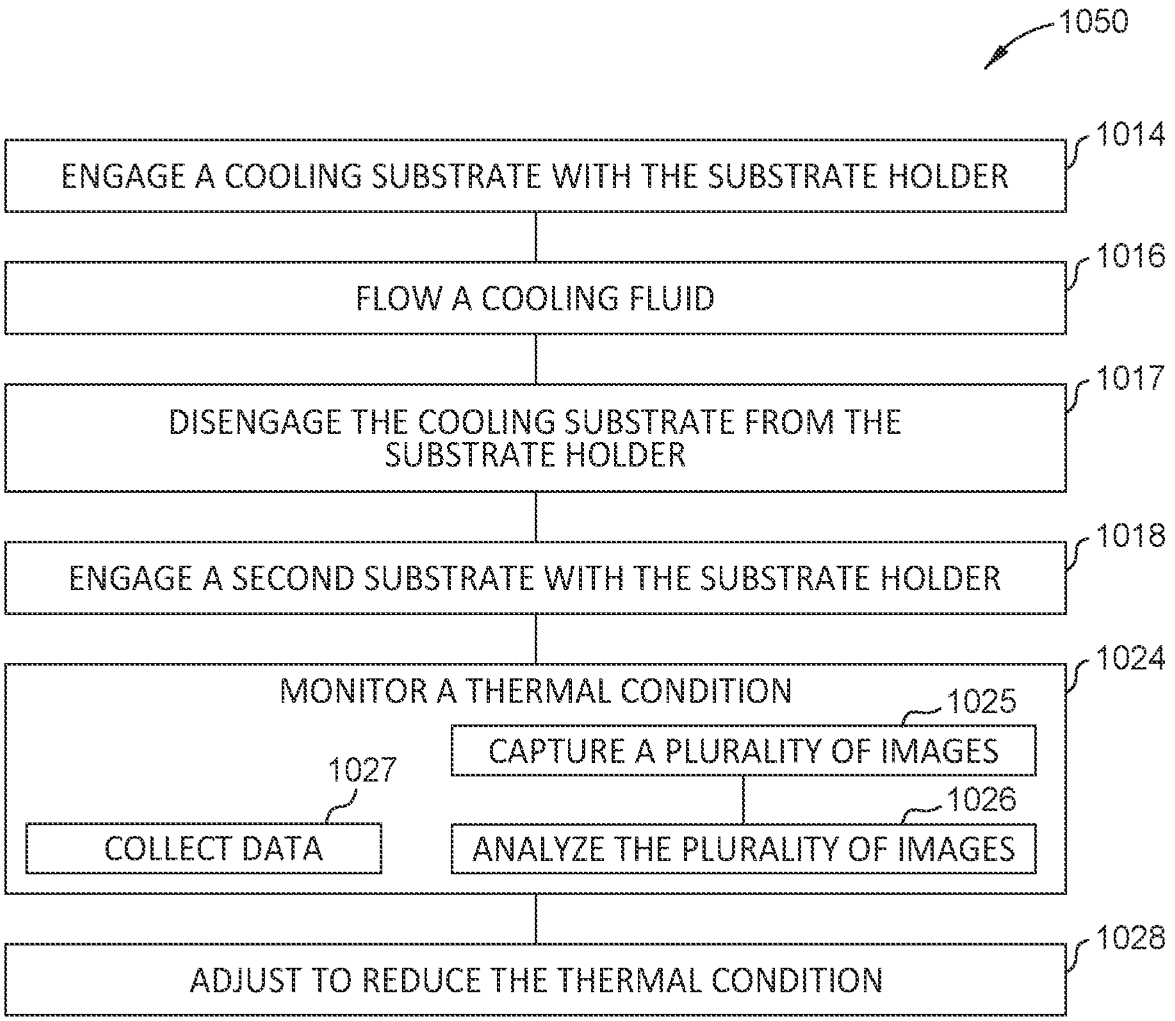
FIG. 10B is a schematic block diagram view of a method of substrate transfer applicable for semiconductor manufacturing, according to one or more embodiments.

FIG. 10B is a schematic block diagram view of a method 1050 of substrate transfer applicable for semiconductor manufacturing, according to one or more embodiments.

Operation 1014 of the method 1050 includes engaging a cooling substrate with the substrate holder for a cooling period to cool at least the portion of the substrate holder to a target cooling temperature. In one or more embodiments, at least one contact section of the substrate holder that is configured to contact a substrate (such as one or all of a plurality of contact sections that are configured to contact the substrate) is engaged with the cooling substrate and cooled to the target cooling temperature. In one or more embodiments, the target cooling temperature of method 1050 is lesser than the target heating temperature of method 1000. Operation 1014 can be referred to as a pre-cooling operation. In one or more embodiments, the method 1050 includes, prior to the engaging (operation 1014) of the cooling substrate with the substrate holder, raising the cooling substrate relative to a support frame.

Operation 1016 includes flowing a cooling fluid through one or more cooling channels formed in the support frame.

Operation 1017 includes disengaging the cooling substrate from the substrate holder.

Operation 1018 includes engaging a second substrate with the substrate holder. In one or more embodiments, the second substrate referenced in relation to the method 1050 is in addition to the substrate referenced in relation to the method 1000. In one or more embodiments, the second substrate referenced in relation to the method 1050 can be referred to as a substrate.

Operation 1024 includes monitoring a thermal condition (e.g., a second thermal condition if monitored in addition to the thermal condition of operation 1019).

In one or more embodiments, the thermal condition is of one or more of the second substrate and/or the substrate holder.

In one or more embodiments, the thermal condition includes a second difference between a second substrate temperature (of the second substrate) and the target cooling temperature, and the second substrate temperature is a temperature of the second substrate prior to the engaging (operation 1018) of the second substrate with the substrate holder. The second substrate temperature can be, for example, a temperature of the second substrate after processing, such as pre-cleaning and/or etching.

In one or more embodiments, the thermal condition includes a return time in which a second deformation of the second substrate is reduced to a second specified level. The second deformation (e.g., bowing) can be caused, for example, by the second substrate engaging (operation 1018) with the substrate holder. In one or more embodiments, the second specified level is a level before the second substrate engages (operation 1018) with the substrate holder.

In one or more embodiments, operation 1025 of the monitoring includes capturing a plurality of images. In one or more embodiments, the plurality of images are captured while the second substrate is engaged with the substrate holder. The images can be images of the substrate holder and/or the second substrate. The images can be images of other components (such as chamber walls, chamber lids, and/or reflectors) that include light reflected from the substrate holder and/or the second substrate In one or more embodiments, operation 1026 of the monitoring includes analyzing the plurality of images to extract information. In one or more embodiments, a physical profile of the images is analyzed. The physical profile can be of, for example, the second substrate and/or the substrate holder. In one or more embodiments, an intensity (such as a pixel concentration of light) of the images is analyzed. The light can be, for example, light of a heating glow (e.g., an orange glow) of the second substrate and/or the substrate holder. The light can be, for example, light from the second substrate and/or the substrate holder that is reflecting off of another component (such as a chamber wall, a chamber lid, and/or a reflector). In one or more embodiments, one or more colors of the images are analyzed. The one or more colors can be, for example, the one or more colors of a heating glow (e.g., an orange glow) of the second substrate and/or the substrate holder. The one or more colors can be, for example, the one or more colors of one or more thermal labels attached (e.g., using adhesive) to the second substrate and/or the substrate holder. The one or more thermal labels are configured to change to one or more different colors at one or more different temperatures.

In one or more embodiments, the information indicates the deformation of the cooling substrate and/or the return time of the cooling substrate. In one or more embodiments, the information indicates the difference between the cooling substrate temperature and the target cooling temperature. In one or more embodiments, the information indicates the second deformation of the second substrate and/or the second return time of the second substrate. In one or more embodiments, the information indicates the second difference between the second substrate temperature and the target cooling temperature.

In place of or in addition to operations 1025, 1026, operation 1027 of the monitoring includes collecting data from one or more other thermal sensors. In one or more embodiments, the one or more other thermal sensors include one or more thermoelectric sensors. The one or more thermoelectric sensors can be attached to one or more of the second substrate and/or the substrate holder. The one or more thermoelectric sensors can be supported by, for example, the substrate supports 322 of the substrate holder 320 (e.g., in place of the substrate 202 and in a shape similar to the shape of the substrate 202). The one or more thermoelectric sensors are in wireless communication with the controller 144. The one or more thermoelectric sensors include one or more thermocouples and use a change in electrical voltage therein to determine a temperature change of one or more of the second substrate and/or the substrate holder.

Other thermal sensors are contemplated for operation 1027, such as one or more pyrometers that measure intensity of lasers reflected off of one or more of the second substrate and/or the substrate holder.

Operation 1028 of the method 1050 includes adjusting one or more of the cooling period and/or the target cooling temperature to reduce the thermal condition. In one or more embodiments, the adjusting of the target cooling temperature includes adjusting a time of the cooling period and/or a flow rate of the cooling fluid.

The present disclosure contemplates that the operations of operation 1024 and/or operation 1028 can be conducted as part of a calibration operation for the pre-cooling of operation 1014.

For example, while operation 1014 is conducted, operation 1024 can be conducted with a "second holder temperature" of the substrate holder used in place of the "second substrate temperature" in operation 1019 to facilitate ensuring that the substrate holder is cooled to the target cooling temperature. If applicable, operation 1028 can include adjusting the target cooling temperature to an adjusted target cooling temperature based on the conduction of operation 1024 using the "second holder temperature in place of the "second substrate temperature."

The present disclosure contemplates that the method 1000 and the method 1050 can be at least partially (such as partially or entirely) combined with each other. For example, a method can conduct operations 1002-1012, operations 1019 and 1023, operations 1014-1018, and operations 1024-1928. In one or more embodiments, the method 1050 is conducted before or after conducting the method 1000. In one or more embodiments, the method 1050 is conducted at least partially simultaneously with the method 1000.

Figure 11A:
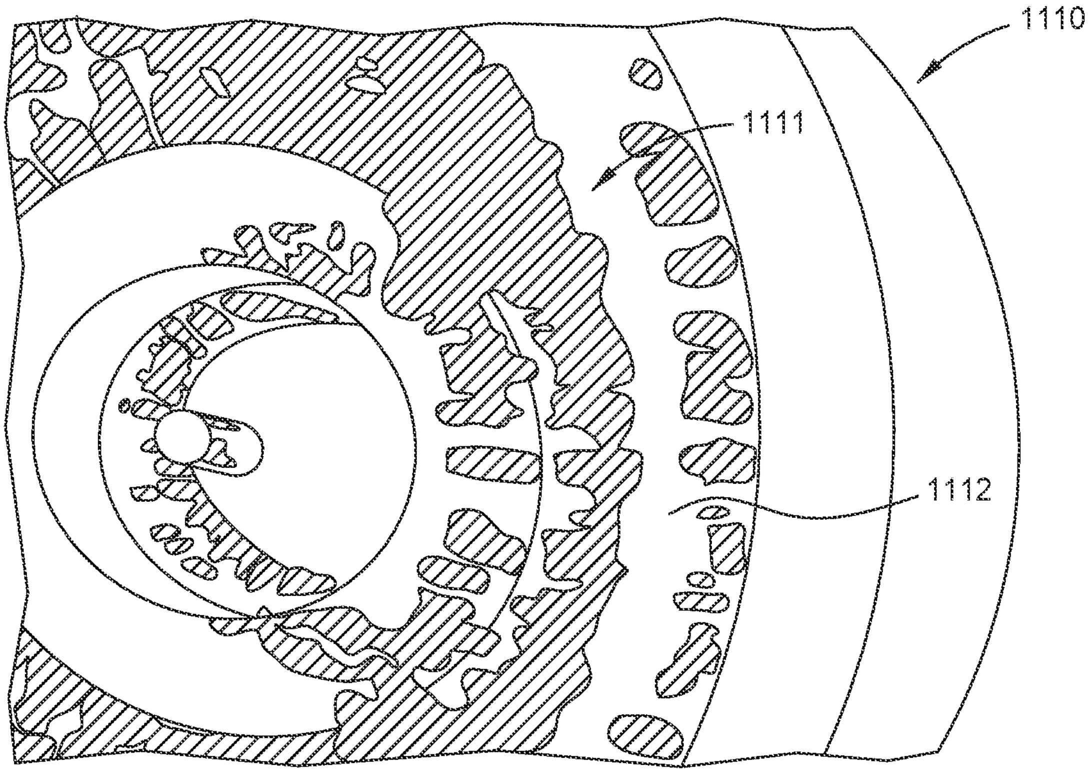
FIGS. 11A and 11B are images of a reflector device, according to one or more embodiments.
Figure 11B:
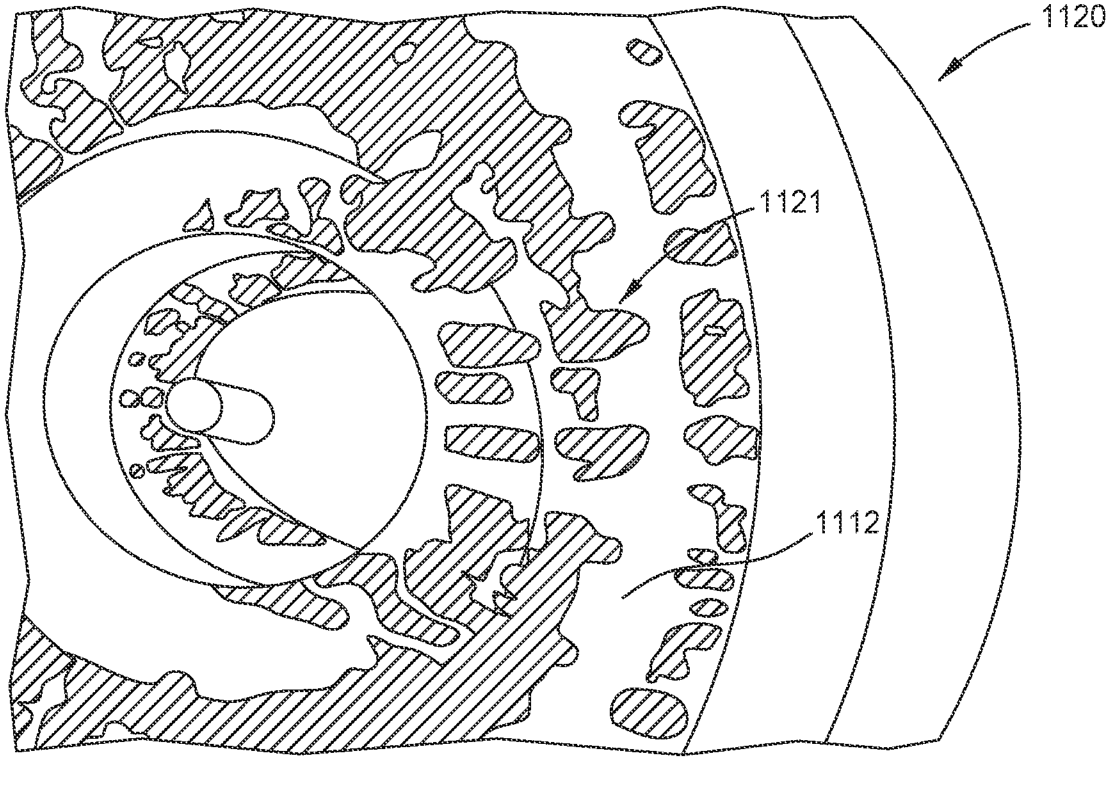

FIGS. 11A and 11B are images 1110, 1120 of a reflector device, according to one or more embodiments. The reflector device can be inserted through, or can be at least part of, the lid 254 shown in FIG. 2.

A first image 1110 is an image of the reflector device at a first time, after the substrate 202 engages with the substrate holder 320 and causes a deformation of the substrate 202. The deformation can be indicated, for example, by an intensity (e.g., a pixel concentration) of a first ring 1111 of reflected light reflecting off of a reflector surface 1112.

A second image 1120 is an image of the reflector device at a second time, after the deformation of the substrate 202 is reduced to a specified level. The return time of the method 1000 and/or the second return time of the method 1050 can be determined by subtracting the first time from the second time. The return time can be within a range 0 seconds to 10 seconds, such as about 2 seconds. The deformation can be indicated, for example, by an intensity (e.g., a pixel concentration) of a second ring 1121 of reflected light reflecting off of the same reflector surface 1112. The intensity of the second ring 1121 is lower than the intensity of the first ring 1111.

In one or more embodiments, operation 1021 and/or operation 1026 of the monitoring includes analyzing the plurality of images to extract information. In one or more embodiments, a physical profile of the images is analyzed. The physical profile can be of, for example, the substrate, the second substrate, and/or the substrate holder. In one or more embodiments, an intensity (such as a pixel concentration of light) of the images is analyzed. The light can be, for example, light of a heating glow (e.g., an orange glow) of the substrate, the second substrate, and/or the substrate holder. The light can be, for example, light from the substrate, the second substrate, and/or the substrate holder that is reflecting off of another component (such as a chamber wall, a chamber lid, and/or a reflector). In one or more embodiments, one or more colors of the images are analyzed. The one or more colors can be, for example, the one or more colors of a heating glow (e.g., an orange glow) of the substrate, the second substrate, and/or the substrate holder.

The one or more colors can be, for example, the one or more colors of one or more thermal labels attached to the substrate, the second substrate, and/or the substrate holder. The one or more thermal labels are configured to change to one or more different colors at one or more different temperatures.

The higher a heating power that is used for processing, the longer it will take for a substrate to cool down to a specified temperature after processing. The longer time means that operations must wait longer for the substrate to cool (which can result in increased downtime and reduced throughput), or a larger temperature difference will exist between the substrate and a substrate holder when the substrate lands on the substrate holder for removal from the chamber. A larger temperature difference between the substrate and the substrate holder can increase the chances of thermal shock (and associated deformation, performance defects, and/or breakage) for the substrate and/or the substrate holder when the substrate contacts the substrate holder.

The subject matter described herein facilitates reduced or eliminated chances of thermal shock (and associated chances of deformation, performance defects, and/or breakage) while facilitating using higher processing temperatures and/or higher heating powers for substrate processing (which facilitates enhanced deposition uniformity and device performance, reduced processing times, reduced downtime, and increased throughput). For example, a heating temperature of 600 degrees Celsius or higher can be used, such as 1,000 degrees Celsius or higher. As an example, the pre-heating and pre-cooling described herein facilitate reduced temperature differences between substrate holders and the substrates that are contacted and then transferred.

Benefits of the present disclosure include reduced or eliminated chances of thermal shock (and associated chances of deformation (e.g., bowing), performance defects, and/or breakage); reduced temperature differences between substrates and substrate holders; faster heating and/or cooling of substrate holders (e.g., reduced cool-down times); reduced or eliminated chances of substrate defects (such as scratching and/or particle accumulation); higher processing temperatures; higher heating powers; enhanced deposition uniformity and device performance; reduced processing times, delays, and downtime; more efficient substrate handling; and increased throughput. Benefits of the present disclosure also include reduced or eliminated need of reducing masses of substrate holders. Such benefits are modular and can be used across a variety of processes and a variety of systems.

It is contemplated that one or more aspects disclosed herein may be combined. As an example, one or more aspects, features, components, operations and/or properties of the various implementations of the system 100, the controller 144, the processing chamber 200, the transfer chamber 300, the substrate holder 320, the one or more heat sources 306, the plurality of heat sources 806, the method 1000, the method 1050, and/or the images 1110, 1120 may be combined. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A transfer chamber applicable for use in semiconductor manufacturing, the transfer chamber comprising:
- an internal volume;
- one or more sidewalls at least partially defining the internal volume;
- a transfer apparatus disposed in the internal volume, the transfer apparatus comprising:
  - one or more links,
  - one or more motors configured to pivot the one or more links, and
  - one or more substrate holders coupled to the one or more links;
- a window comprising a transparent material, the window corresponding to a heat region in the internal volume, the heat region offset from the one or more motors; and
- one or more heat sources configured to direct heat into the internal volume through the window to heat the one or more substrate holders prior to contacting a substrate.

2. The transfer chamber of claim 1, further comprising one or more cooling stations disposed in the internal volume, each of the one or more cooling stations comprising:
- a support frame;
- a cooling substrate supported by the support frame; and
- one or more lift devices configured to raise and lower the cooling substrate relative to the support frame.

3. The transfer chamber of claim 2, wherein the support frame comprises one or more cooling channels extending to a support surface of the support frame to direct a cooling fluid to a backside surface of the cooling substrate.

4. The transfer chamber of claim 2, wherein the transfer apparatus further comprises a rotatable base, and the window and the one or more cooling stations are aligned radially between the rotatable base and the one or more sidewalls.

5. The transfer chamber of claim 2, wherein the cooling substrate comprises silicon carbide (SiC).

6. The transfer chamber of claim 5, wherein the transparent material of the window comprises quartz (SiO2).

7. The transfer chamber of claim 2, wherein the one or more substrate holders comprise:
- a body; and
- a plurality of substrate supports inserted at least partially into the body and comprising silicon carbide (SiC).

8. The transfer chamber of claim 7, wherein each of the plurality of substrate supports comprises:
- an inner segment; and
- one or more fins extending outwardly relative to the inner segment, wherein each of the inner segment and the one or more fins comprises the silicon carbide (SiC).

9. The transfer chamber of claim 8, wherein the body of the one or more substrate holders comprises:
- a plurality of arms defining a support face, the plurality of arms having an arm thickness, and the plurality of arms comprising quartz (SiO2).

10. The transfer chamber of claim 9, wherein the cooling substrate has a substrate thickness that is larger than the arm thickness.

11. The transfer chamber of claim 7, wherein the body has a first thermal conductivity that is lesser than a second thermal conductivity of the cooling substrate.

12. A system applicable for semiconductor manufacturing, the system comprising:
- a transfer chamber comprising:
  - an internal volume,
  - a transfer apparatus disposed in the internal volume, the transfer apparatus comprising:

one or more links, one or more motors configured to pivot the one or more links, and a substrate holder coupled to the one or more links;

a window comprising a transparent material, one or more heat sources configured to direct heat into the internal volume through the window, and one or more thermal sensors configured to detect a thermal condition;

a deposition chamber interfacing with the transfer chamber;

a controller comprising instructions that, when executed, cause:

moving the substrate holder to align the substrate holder with one or more fields of heating of the one or more heat sources;

powering the one or more heat sources to heat at least a portion of the substrate holder for a heating period to a target heating temperature;

after the heating of the substrate holder to the target heating temperature, moving the substrate holder into a processing volume of the deposition chamber;

engaging a substrate in the deposition chamber with the substrate holder after the heating of the substrate holder to the target heating temperature; and moving the substrate out of the processing volume while the substrate is supported on the substrate holder.

13. The system of claim 12, wherein the instructions, when executed, further cause:

disengaging the substrate from the substrate holder; and engaging a cooling substrate with the substrate holder for a cooling period to cool at least the portion of the substrate holder to a target cooling temperature that is lesser than the target heating temperature.

14. The system of claim 13, wherein the instructions, when executed, further cause, prior to the engaging of the cooling substrate with the substrate holder:

raising the cooling substrate relative to a support frame.

15. The system of claim 14, wherein the instructions, when executed, further cause flowing a cooling fluid through one or more cooling channels formed in the support frame.

16. The system of claim 13, wherein the instructions, when executed, further cause:

monitoring a thermal condition of one or more of the substrate or the substrate holder; and adjusting one or more of the heating period, the target heating temperature, the cooling period, or the target cooling temperature to reduce the thermal condition.

17. The system of claim 16, wherein the thermal condition includes a difference between a substrate temperature and the target heating temperature, and the substrate temperature is a temperature of the substrate prior to the engaging of the substrate with the substrate holder.

18. The system of claim 16, wherein the thermal condition includes a return time in which a deformation of the substrate is reduced to a specified level.

19. The system of claim 18, wherein the monitoring comprises:

capturing a plurality of images while the substrate is engaged with the substrate holder; and analyzing the plurality of images to extract information indicating the deformation.

20. A transfer chamber applicable for use in semiconductor manufacturing, the transfer chamber comprising:

an internal volume;

one or more sidewalls at least partially defining the internal volume;

a transfer robot disposed in the internal volume, the transfer robot comprising:

one or more motors, and one or more substrate holders;

a window comprising a transparent material, the window corresponding to a heat region in the internal volume, the heat region offset from the one or more motors; and one or more heat sources configured to direct heat into the internal volume through the window to heat the one or more substrate holders prior to contacting a substrate.

* * * * *